US009696388B2

(12) United States Patent
Chang et al.

(10) Patent No.: US 9,696,388 B2
(45) Date of Patent: Jul. 4, 2017

(54) MAGNETIC SENSING APPARATUS AND MAGNETIC SENSING METHOD THEREOF

(71) Applicant: Industrial Technology Research Institute, Hsinchu (TW)

(72) Inventors: Yuan-Tai Chang, New Taipei (TW); Kai-Cheung Juang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 262 days.

(21) Appl. No.: 14/591,932

(22) Filed: Jan. 8, 2015

(65) Prior Publication Data
US 2016/0169983 A1   Jun. 16, 2016

(30) Foreign Application Priority Data

Dec. 11, 2014   (TW) .............................. 103143273 A

(51) Int. Cl.
G01R 33/00         (2006.01)
(52) U.S. Cl.
CPC ..... *G01R 33/0017* (2013.01); *G01R 33/0035* (2013.01)
(58) Field of Classification Search
None
See application file for complete search history.

(56) References Cited

U.S. PATENT DOCUMENTS

| 4,305,034 | A | | 12/1981 | Long et al. |
| 4,752,733 | A | * | 6/1988 | Petr ................. G01D 3/021 324/225 |
| 6,825,709 | B2 | | 11/2004 | Motz |
| 8,120,354 | B2 | | 2/2012 | Stephanson et al. |
| 8,134,358 | B2 | | 3/2012 | Charlier et al. |
| 8,350,563 | B2 | | 1/2013 | Haas et al. |
| 8,680,846 | B2 | | 3/2014 | Cesaretti et al. |

(Continued)

FOREIGN PATENT DOCUMENTS

| CN | 101960319 | 1/2011 |
| TW | 509883 | 11/2002 |

(Continued)

OTHER PUBLICATIONS

"Office Action of Taiwan Counterpart Application", issued on Jun. 7, 2016, p. 1-p. 5.

(Continued)

*Primary Examiner* — Jermele M Hollington
(74) *Attorney, Agent, or Firm* — Jianq Chyun IP Office

(57) ABSTRACT

A magnetic sensing apparatus and a magnetic sensing method thereof are provided. The magnetic sensing apparatus includes a reference magnetic field (MF) generating unit, a MF sensing unit, a signal processing unit, a calibration unit and a frequency generating unit. The MF sensing unit senses an external MF and a reference MF to provide a MF sensing signal. The signal processing unit receives and transfers the MF sensing signal into an output signal. The calibration unit calibrates the output signal according to the MF sensing signal. The frequency generating unit provides an operating frequency. The reference MF generating unit provides the reference MF according to the operating frequency, and the MF sensing unit senses the external MF and the reference MF according to the operating frequency.

14 Claims, 8 Drawing Sheets

(56) References Cited

U.S. PATENT DOCUMENTS

| | | | | |
|---|---|---|---|---|
| 9,404,991 B2* | 8/2016 | Anelli | ............... | G01R 33/0017 |
| 2007/0247141 A1* | 10/2007 | Pastre | ............... | G01R 33/0035 |
| | | | | 324/202 |
| 2008/0246471 A1 | 10/2008 | Kahlman et al. | | |
| 2013/0080087 A1* | 3/2013 | Donovan | ........... | G01R 33/0029 |
| | | | | 702/57 |
| 2013/0093412 A1 | 4/2013 | Anelli et al. | | |
| 2013/0134965 A1 | 5/2013 | Friedrich et al. | | |
| 2014/0184214 A1 | 7/2014 | Schaffer et al. | | |

FOREIGN PATENT DOCUMENTS

| | | |
|---|---|---|
| TW | I261680 | 9/2006 |
| TW | I436082 | 5/2014 |

OTHER PUBLICATIONS

Michel Demierre, "Improvements of CMOS Hall Microsystems and Application for Absolute Angular Position Measurements," Ecole Polytechnique Federale de Lausanne, PHD Thesis, Sep. 2003, pp. 86-120.

Melexis, Inc., "MLX90288: SMD Programmable Linear Hall Sensor IC Featuring Analog Ratiometric Output," Melexis datasheet, May 2012, pp. 1-19.

Infineon Technologies, "TLE4998C3, TLE4998C4: Programmable Linear Hall Sensor," infineon datasheet, Dec. 2008, pp. 1-44.

* cited by examiner

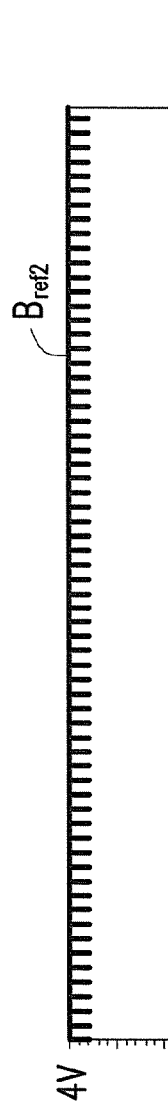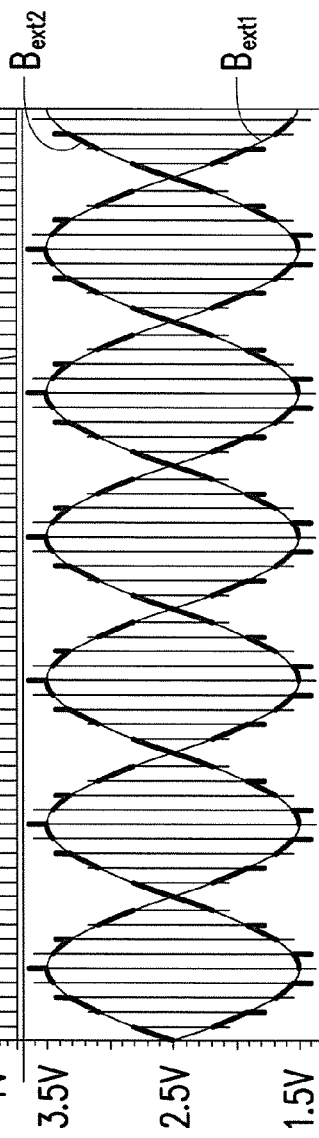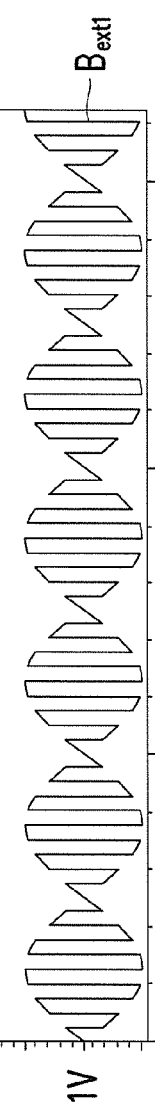

MAGNETIC SENSING APPARATUS AND MAGNETIC SENSING METHOD THEREOF

CROSS-REFERENCE TO RELATED APPLICATION

This application claims the priority benefit of Taiwan application serial no. 103143273, filed on Dec. 11, 2014. The entirety of the above-mentioned patent application is hereby incorporated by reference herein and made a part of this specification.

TECHNICAL FIELD

The disclosure is related to a sensing apparatus and more particularly, to a magnetic sensing apparatus and a magnetic sensing method thereof.

BACKGROUND

At present, magnetic sensors have been widely applied to vehicles, industrial and consumer electronics, of which each can sense magnetic field (MF) disturbance to generate an output voltage. The magnetic sensor can be applied in sensing physical parameters of a MF object (e.g., a motor), such as a revolutions per minute (rpm), a position and an angle, in a non-contact loss-less sensing manner, such that a control system can control the MF object by using the physical parameters. The magnetic sensor can be applied to equipment (e.g., engines, crankshafts, tires, windows) in a vehicle, industrial current sensing, robot operation control or auto-zooming of a camera.

However, the magnetic sensor is susceptible to environment. For example, poor ambient conditions, such as huge change in temperature or humidity, a shock caused by an external force, all bring challenges to the magnetic sensors. Currently, in order to resolve the issues occurring to the magnetic sensor, the magnetic sensor can be equipped with multiple sets of magnetic sensing probes for measuring an external MF simultaneously, which unfortunately leads to higher manufacturing cost and matching degree among the multiple sets of magnetic sensing probes. Nevertheless, in a scenario where a back-end signal processing circuit is adopted to calibrate a sensing result, it has to take more time on signal processing to achieve a certain degree of accuracy.

SUMMARY

According to an exemplary embodiment of the disclosure, a magnetic sensing apparatus is introduced herein. The magnetic sensing apparatus includes a reference MF generating unit, an MF sensing unit, a signal processing unit, a calibration unit and a frequency generating unit. The reference MF generating unit is configured to provide a reference MF. The MF sensing unit is configured to sense an external MF and the reference MF to provide an MF sensing signal. The signal processing unit is coupled to the MF sensing unit and configured to receive and transfer the MF sensing signal into an output signal. The calibration unit is coupled to the signal processing unit and configured to calibrate the output signal according to the MF sensing signal. The frequency generating unit is coupled to the reference MF generating unit and the MF sensing unit and configured to provide an operating frequency. The reference MF generating unit provides the reference MF according to the operating frequency, and the MF sensing unit senses the external MF and the reference MF according to the operating frequency.

According to an exemplary embodiment of the disclosure, a magnetic sensing method of a magnetic sensing apparatus is introduced and includes the following steps. A reference MF is generated according to an operating frequency. An external MF and the reference MF is sensed according to the operating frequency to generate an MF sensing signal. The MF sensing signal is transferred into an output signal, and the output signal is calibrated according to the MF sensing signal.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 3A through FIG. 3C are signal waveform graphs of the magnetic sensing apparatus according to an exemplary embodiment of the disclosure.

DESCRIPTION OF EMBODIMENTS

Figure 1:
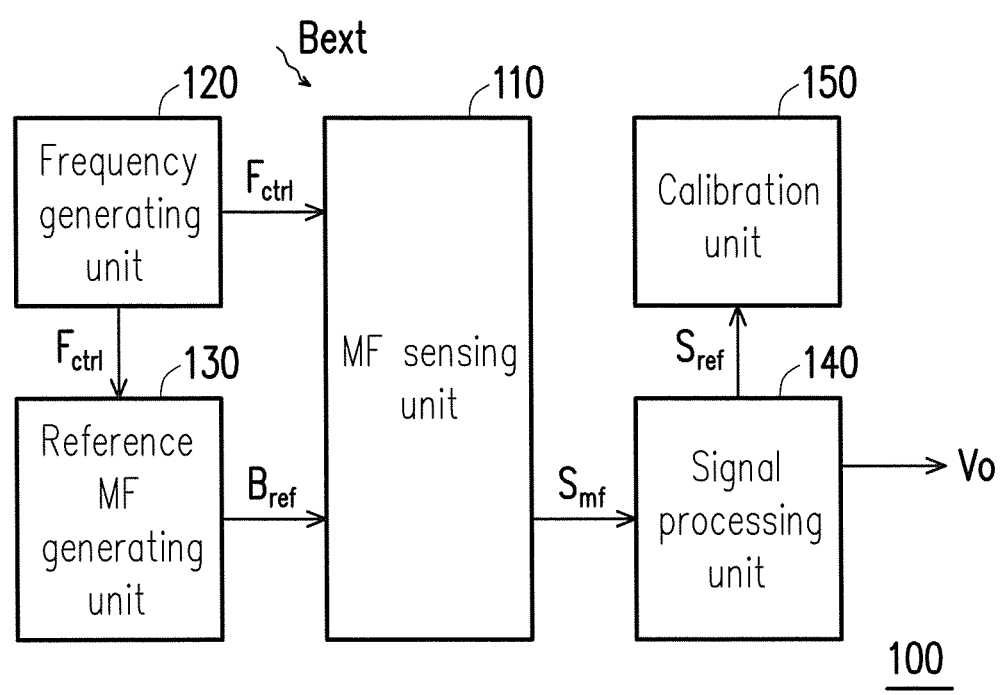
FIG. 1 is a schematic circuit block diagram illustrating a magnetic sensing apparatus according to an exemplary embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." Moreover, wherever appropriate in the drawings and embodiments, elements/components/steps with the same reference numerals represent the same or similar parts. Elements/components/steps with the same reference numerals or names in different embodiments may be cross-referenced.

FIG. 1 is a schematic circuit block diagram illustrating a magnetic sensing apparatus according to an exemplary embodiment of the disclosure. With reference to FIG. 1, a magnetic sensing apparatus 100 of the present exemplary embodiment includes a magnetic field (MF) sensing unit 110, a frequency generating unit 120, a reference MF generating unit 130, a signal processing unit 140 and a calibration unit 150. In the present exemplary embodiment, the reference MF generating unit 130 provides a reference MF Bref. The MF sensing unit 110 senses an external MF Bext and the reference MF Bref to provide an MF sensing signal Smf. The signal processing unit 140 is coupled to the MF sensing unit 110, receives and transfers the MF sensing signal Smf into an output signal Vo. The calibration unit 150 is coupled to the signal processing unit 140 and configured to calibrate the output signal Vo according to the MF sensing signal Smf. The frequency generating unit 120 is coupled to the reference MF generating unit 130 and the MF sensing unit 110, and configured to provide an operating frequency Fctrl. Therein, the reference MF generating unit 130 provides reference MF Bref according to the operating frequency Fctrl, and the MF sensing unit 110 senses the external MF Bext and the reference MF Bref according to the operating frequency Fctrl.

In the present exemplary embodiment, the reference MF generating unit 130 may be implemented by means of an inductor or a coil designed in a closed-loop manner, but the disclosure is not limited thereto. The reference MF generating unit 130 is capable of continuously and stably providing the reference MF Bref, without being affected due to the external MF Bext or any ambient condition. The MF sensing unit 110 may be an MF probe commonly configured to sense MF disturbance to generate a corresponding output voltage. For instance, the MF probe may sense physical quantities of an MF object (e.g., a motor), such as a revolutions per minute (rpm), a position and an angle in a non-contact manner, which is accordingly provided to a control system using the magnetic sensing apparatus. Generally, the MF probe is provided with a mechanism with respect to modulation of sensitivity of the MF probe by means of adjusting the operating frequency and a frequency modulation circuit. Thus, after the reference MF generating unit 130 and the MF sensing unit 110 are operated according to the operating frequency Fctrl, the frequency modulation circuit in the MF sensing unit 110 achieves a signal synchronized excitation effect due to the reference MF Bref and the MF sensing unit 110 having the same operating frequency.

In the present exemplary embodiment, after sensing the reference MF Bref and the external MF Bext having the same operating frequency Fctrl, the MF sensing unit 110 provides the MF sensing signal Smf. The MF sensing signal Smf includes a first MF sensing signal having a first frequency (e.g., a relatively high frequency) and a second MF sensing signal having a second frequency (e.g., a relatively low frequency), in which the first frequency is greater than the second frequency. The first MF sensing signal having the relatively high frequency is generated by an inductance element of the MF probe in the MF sensing unit 110 according to the reference MF Bref, while the second MF sensing signal having the relatively low frequency is generated according to the external MF Bext. Significant change occurs to the first MF sensing signal and the second MF sensing signal after being further processed by the frequency modulation circuit in the MF probe. For example, the first MF sensing signal having the relatively high frequency is processed as a DC reference signal due to the frequency modulation circuit and its operating frequency. In contrast, the second MF sensing signal having the relatively low frequency is processed as a sensing signal with a relatively high frequency due to the modulation circuit and its operating frequency. The DC reference signal corresponds to the reference MF Bref of the reference MF generating unit 130, and the high-frequency sensing signal corresponds to the external MF Bext. The calibration unit 150 of the present exemplary embodiment provides the calibration signal according to the DC reference signal corresponding to the MF sensing signal Smf processed by the frequency modulation circuit, so as to calibrate the output signal Vo.

To be specific, the signal processing unit 140 of the present exemplary embodiment receives the reference MF Bref and the external MF Bext sensed by the MF sensing unit 110 to generate the MF sensing signal Smf and separates the corresponding DC reference signal and the high-frequency sensing signal therefrom respectively. Since a value of the reference MF Bref corresponds to a voltage level of the DC reference signal, the calibration unit 150 serves the separated DC reference signal as a calibration amount of the output signal Vo, so as to calibrate sensitivity of the MF sensing unit 110.

It should be noted that the calibration may also be performed on different frequency points of the operating frequency Fctrl provided by the frequency generating unit 120 in the present exemplary embodiment by employing dynamic excitation frequency adjustment (DEFA). In the present exemplary embodiment, the operating frequency Fctrl and the reference MF Bref are adjusted to the same frequency level by employing the signal synchronized excitation effect, and thus, persons who apply the present exemplary embodiment may also dynamically adjust the operating frequency Fctrl to adjust the different frequency points, such that the reference MF generating unit 130 even at different frequency points can provide the reference MF Bref in different ways. Furthermore, under the DEFA operation, the persons who apply the present exemplary embodiment may shift the frequency of the operating frequency Fctrl and the reference MF Bref having the same frequency by means of the signal synchronized excitation effect, such that the different frequency points may be calibrated to achieve a complete and accurate frequency response.

Figure 2:
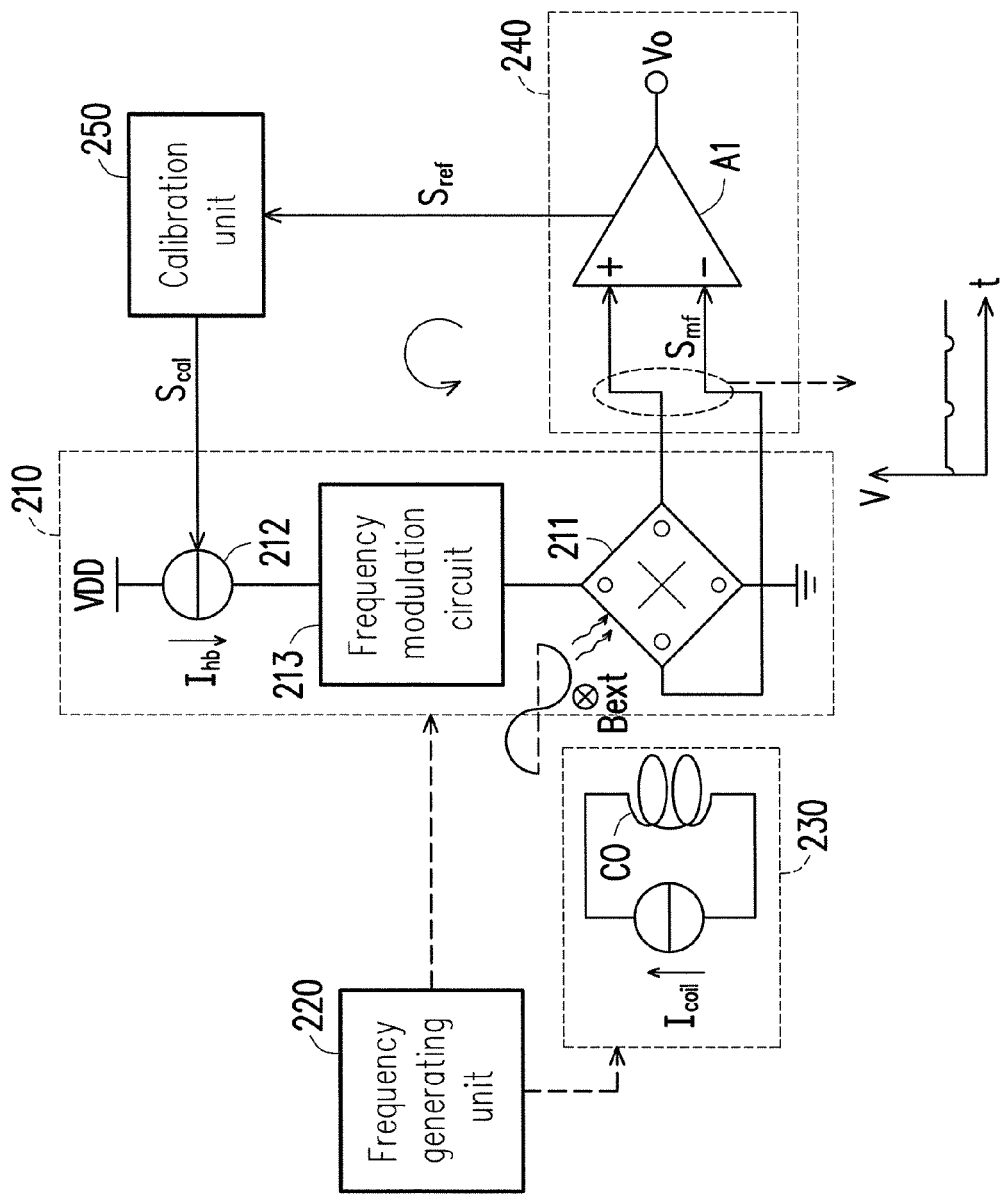
FIG. 2 is a schematic circuit diagram illustrating a magnetic sensing apparatus according to an exemplary embodiment of the disclosure.

FIG. 2 is a schematic circuit diagram illustrating a magnetic sensing apparatus according to an exemplary embodiment of the disclosure. With reference to FIG. 1 and FIG. 2, descriptions with respect to a reference MF generating unit 230, an MF sensing unit 210, a calibration unit 250 and a signal processing unit 240 of the present exemplary embodiment may substantially refer to the operations of the blocks 130, 110, 250 and 240 in the preceding exemplary embodiment. In the present exemplary embodiment, the reference MF generating unit 230 includes a coil CO and an induced current Icoil, and the reference MF generating unit 230 provides the reference MF Bref by means of electromagnetic induction. The MF sensing unit 210 of the present exemplary embodiment may include an MF probe 211, a bias circuit 212 and a frequency modulation circuit 213. In the present exemplary embodiment, the bias circuit 212 is illustrated as a current source for example and is configured to generate a driving current Ihb. The persons who apply the present exemplary embodiment may implement the bias circuit 212 by using any other bias circuit or current mirror circuit. The MF probe 211 is coupled to the bias circuit 212, in which the MF probe 211 receives the driving current Ihb to sense the external MF Bext and the reference MF Bref, and a value of the driving current Ihb corresponds to sensitivity of the MF sensing unit 210. The frequency modulation circuit 213 is a circuit originally disposed in the MF probe 211 and illustrated in FIG. 2 for descriptive convenience, and capability of the frequency modulation circuit 213 may refer to the related description above.

In the present exemplary embodiment, the signal processing unit 240 may include a first amplifier A1. An input terminal of the first amplifier A1 is configured to receive the MF sensing signal Smf and an output terminal of the first amplifier A1 is configured to transfer the MF sensing signal Smf into the output signal Vo. In the present exemplary embodiment, the calibration unit 250 receives a reference sensing signal Sref with respect to the MF sensing signal Smf from the first amplifier A1, generates a calibration signal Scal according to the reference sensing signal Sref and transmits the calibration signal Scal to the bias circuit 212 to adjust the driving current Ihb of the bias circuit 212, so as to adjust sensitivity of the MF probe 211. Specifically, a DC part may be separated from the MF sensing signal Smf of the present exemplary embodiment by using the first amplifier A1, the calibration unit 250 may receive the reference sensing signal Sref having the DC part of the MF sensing signal Smf from the first amplifier A1, and then provide the calibration signal Scal according to the DC part.

It should be noted that the driving current Ihb provided by the bias circuit 212 of the MF sensing unit 210 may serve to adjust the sensitivity of the MF probe 211 in the MF sensing unit 210. Namely, if the sensitivity of the MF probe 211 is affected by the external environment, the MF sensing unit 210 may adjust the driving current Ihb provided by the bias circuit 212 to improve the sensitivity of the MF probe 211. Thus, the MF sensing unit 210 needs a stable and uneasily affected reference MF as a reference value, which is the reference MF Bref of the reference MF generating unit 230 in the present exemplary embodiment. In particular, the MF sensing unit 210 has to modulate a frequency originally input to the MF sensing unit 210, for example, as a carrier frequency, to adjust the driving current Ihb. Then, the frequency generating unit 220 of the present embodiment provides the operating frequency Fctrl with the carrier frequency characteristics to the MF sensing unit 210 and the reference MF generating unit 230, such that the MF sensing unit 210 and the reference MF generating unit 230 may have the same frequency level, so as to achieve the signal synchronized excitation effect.

FIG. 3A through FIG. 3C are signal waveform graphs of the magnetic sensing apparatus according to an exemplary embodiment of the disclosure. In FIG. 3A, reference MFs Bref1 and Bref2 are provided by the reference MF generating unit 230. Referring to FIG. 3A, in the present exemplary embodiment, the reference MFs Bref1 and Bref2MF sensed by the sensing unit 210 respectively have stable voltage levels of 1V and 4V. In FIG. 3B, external MFs Bext1 and Bext2 sensed by both the magnetic sensing apparatus 210 are sine waves. Accordingly, in the present exemplary embodiment, in the MF sensing signal Smf provided by the MF sensing unit 210 sensing the reference MFs Bref1 and Bref2 and the external MFs Bext1 and Bext2, the DC reference signal corresponds to the reference MFs Bref1 and Bref2, and the high-frequency sensing signal corresponds to the external MFs Bext1 and Bext2. Thus, in the present exemplary embodiment, after receiving the MF sensing signal Smf, the signal processing unit 240 transfers the MF sensing signal Smf from an analog signal into a digital signal. In FIG. 3C, after the MF sensing signal Smf is input to the signal processing unit, the mixed external MFs Bext1 and Bext2 originally illustrated in FIG. 3B are separated according to the reference MFs Bref1 and Bref2, and as shown in FIG. 3C, the external MF Bext1 is separated to a position of 1V corresponding to the reference MF Bref1, and the external MF Bext2 is separated to a position of 4V corresponding to the reference MF Bref2.

Figure 4:
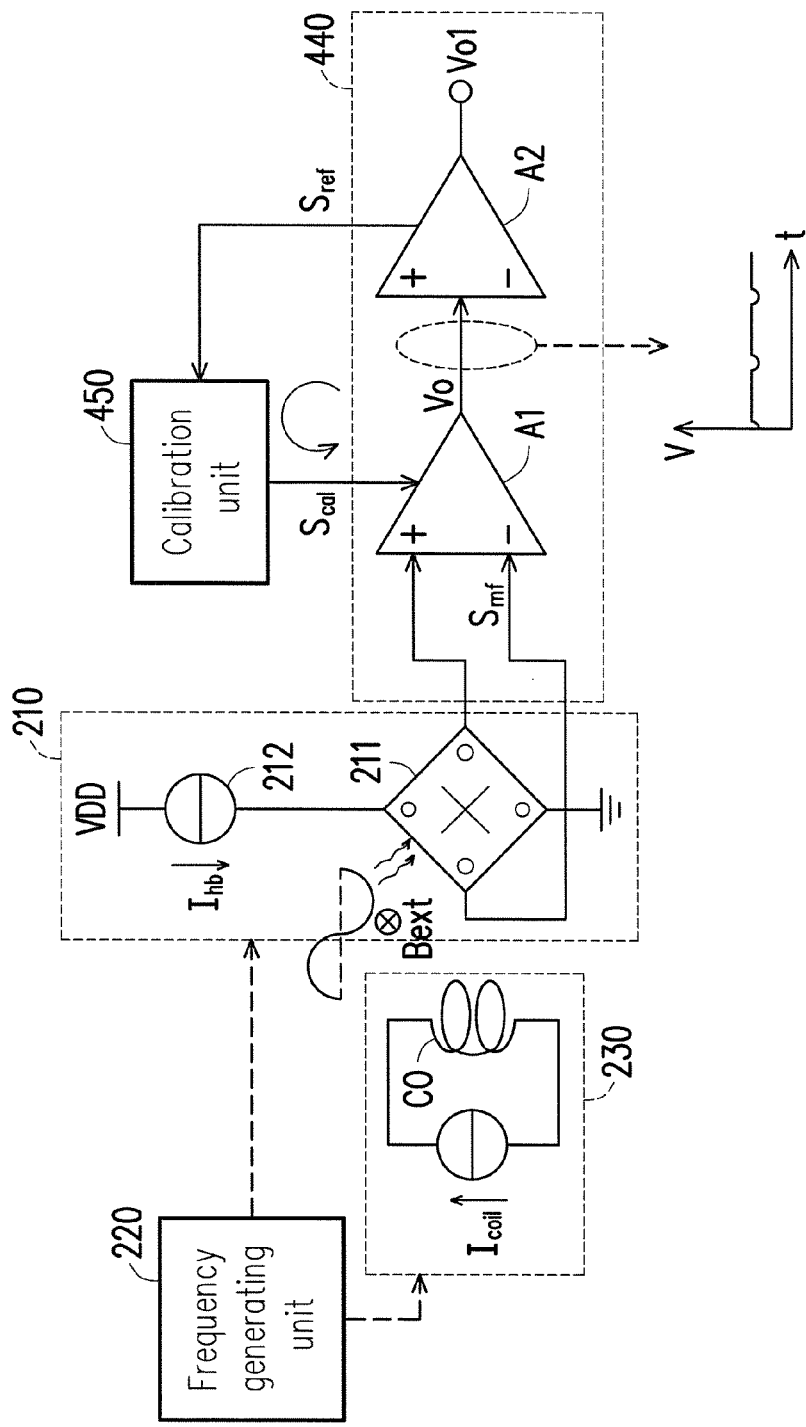
FIG. 4 is a schematic circuit diagram illustrating a magnetic sensing apparatus according to an exemplary embodiment of the disclosure.

FIG. 4 is a schematic circuit diagram illustrating a magnetic sensing apparatus according to an exemplary embodiment of the disclosure. With reference to FIG. 1 through FIG. 4, the same elements use the same reference numbers, which may refer to the exemplary embodiments above. The present exemplary embodiment is different from the exemplary embodiment illustrated in FIG. 2 in operations of a signal processing unit 440 and a calibration unit 350 of the present exemplary embodiment. The signal processing unit 440 of the present exemplary embodiment includes not only the first amplifier A1, but also a second amplifier A2. An input terminal of the first amplifier A1 is configured to receive the MF sensing signal Smf, and an output terminal of the first amplifier A1 is configured to transfer the MF sensing signal Smf into the output signal Vo. An input terminal of the second amplifier A2 is configured to receive the output signal Vo from the first amplifier, and an output terminal of the second amplifier A2 is configured to transfer the output signal Vo into a second-level output signal Vo1. A calibration unit 450 of the present exemplary embodiment receives the reference sensing signal Sref with respect to the MF sensing signal Smf from the second amplifier A2, generates the calibration signal Scal according to the reference sensing signal and transmits the calibration signal Scal to the first amplifier A1 to adjust a gain of the first amplifier A1, so as to calibrate the output signal Vo. That is, the signal processing unit 440 of the present exemplary embodiment adjusts the MF sensing signal Smf by using the first amplifier A1 and the second amplifier A2 in a two-level signal processing means. It should be noted that the disclosure is not intent to limit the number of levels for performing the signal processing, and in other embodiments, the signal processing unit may also include three or more amplifiers coupled in serial for implementation.

Figure 5:
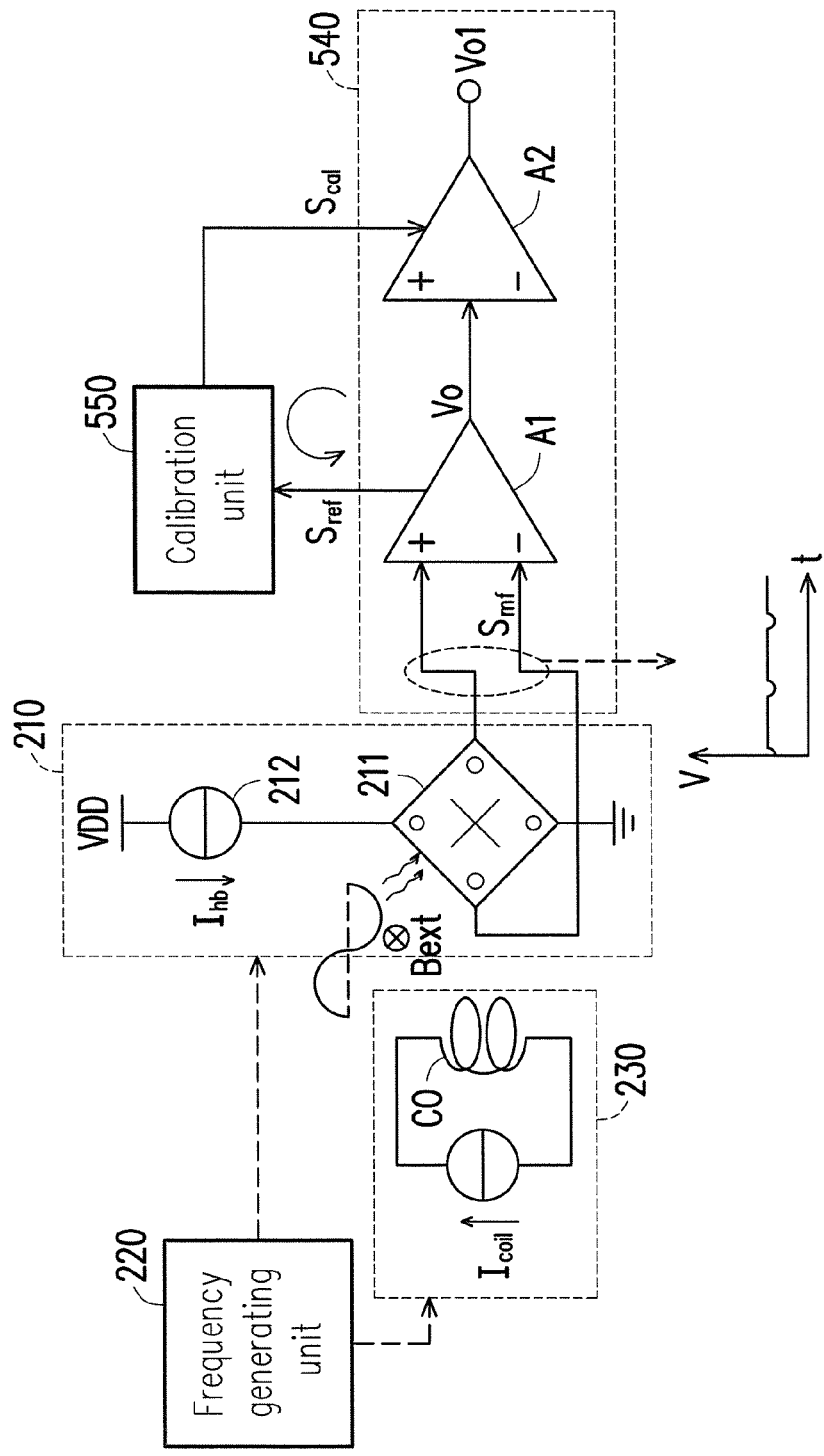
FIG. 5 is a schematic circuit diagram illustrating a magnetic sensing apparatus according to an exemplary embodiment of the disclosure.

FIG. 5 is a schematic circuit diagram illustrating a magnetic sensing apparatus according to an exemplary embodiment of the disclosure. With reference to FIG. 1 through FIG. 5, the same elements use the same reference numbers, which may refer to the exemplary embodiments above. A signal processing unit 540 of the present exemplary embodiment includes the first amplifier A1 and the second amplifier A2 in the same way as the signal processing unit 440 illustrated in FIG. 3A through FIG. 3C, though they are different from each other in the calibration unit 550 of the present exemplary embodiment receiving the reference sensing signal Sref with respect to the MF sensing signal 210 from the first amplifier A1, generating the calibration signal Scal according to the reference sensing signal Sref and transmitting the calibration signal Scal to the second amplifier A2 to adjust a gain of the second amplifier A2, so as to adjust the second-level output signal Vo1. As for the operations manners of the signal processing unit 440 illustrated in FIG. 4 and the signal processing unit 540 illustrated in FIG. 5, the signal processing unit 440 achieves signal feedback from the second amplifier A2 to the first amplifier A1 by using the calibration unit 450. Namely, in a scenario that a shift occurs to the first amplifier A1, the second amplifier A2 compensates the first amplifier A1 to calibrate the output signal Vo of the first amplifier. In the present exemplary embodiment, the signal processing unit 540 achieves signal feedfoward from the first amplifier A1 to the second amplifier A2 by using the calibration unit 550. Namely, in a scenario if it is predicted that a shift may occur to the second amplifier A2, the first amplifier A1 first compensates the second amplifier A2 to directly calibrate the second-level output signal Vo1 of the second amplifier A2. Likewise, the disclosure is not intent to limit the number of the amplifiers of the signal processing unit 540 of the present exemplar embodiment.

Figure 6:
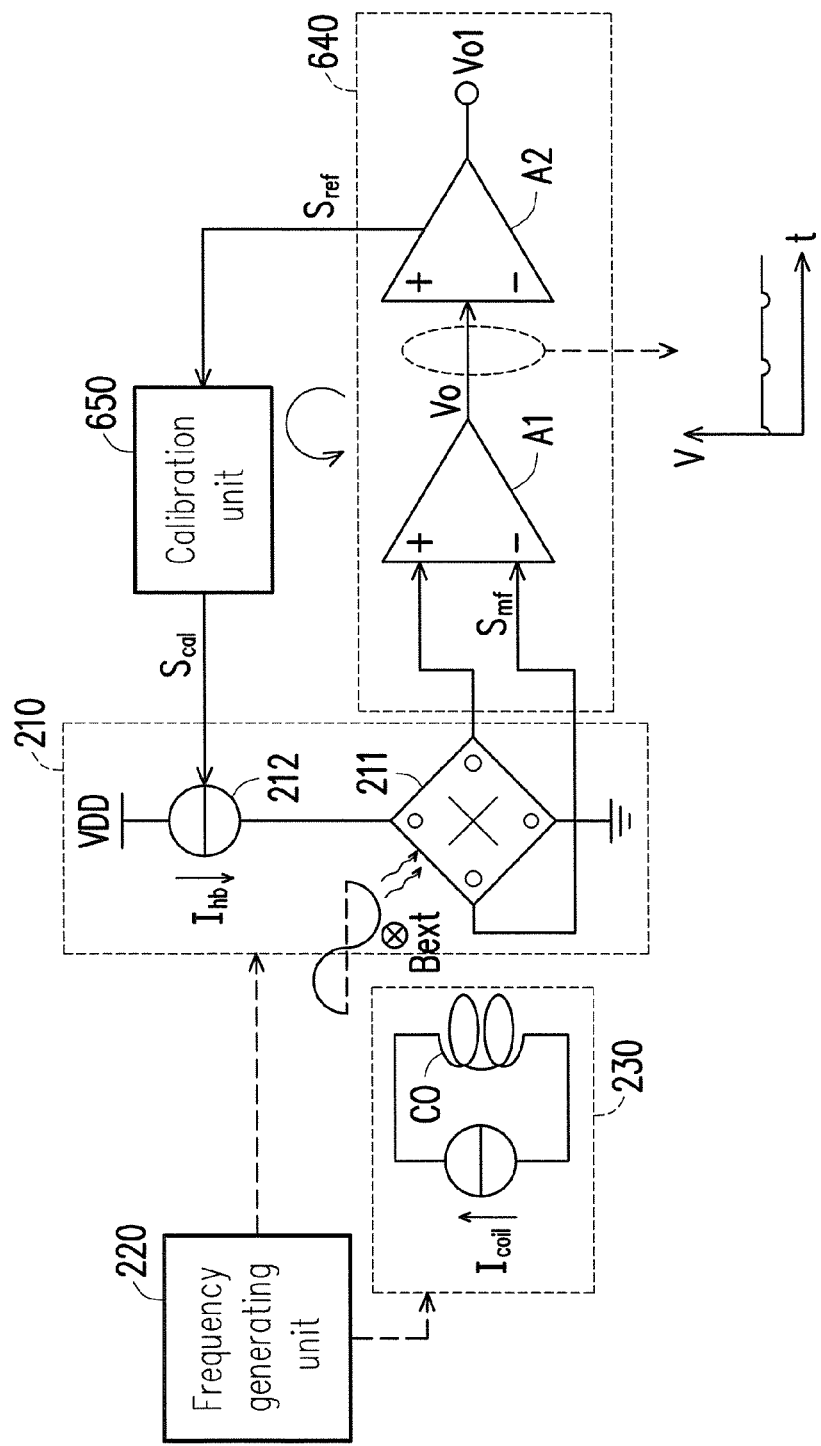
FIG. 6 is a schematic circuit diagram illustrating a magnetic sensing apparatus according to an exemplary embodiment of the disclosure.

FIG. 6 is a schematic circuit diagram illustrating a magnetic sensing apparatus according to an exemplary embodiment of the disclosure. With reference to FIG. 1, FIG. 2, FIG. 3A through FIG. 3C and FIG. 6, the same elements use the same reference numbers, which may refer to the exemplary embodiments above. Both a signal processing unit 640 of the present exemplary embodiment and the signal processing unit 440 of the exemplary embodiment illustrated in FIG. 4 have the first amplifier A1 and the second amplifier A2 in the same way, though they are different from each other in the calibration unit of the present exemplary embodiment receiving the reference sensing signal Sref with respect to the MF sensing signal Smf from the second amplifier A2, generating the calibration signal Scal according to the reference sensing signal Sref and transmitting the calibration signal Scal to the bias circuit 212 to adjust the driving current Ihb of the bias circuit 212, so as to adjust the sensitivity of the MF probe 211. To be specific, the calibration unit 650 of the present exemplary embodiment performs the two-level signal processing by using the first amplifier A1 and the second amplifier A2 signal processing unit 640, so as to adjust the bias circuit 212. The disclosure is not intent to limit the number of levels for performing the signal processing, and in other embodiments, the signal processing unit may also include three or more amplifiers coupled in serial for implementation.

Figure 7:
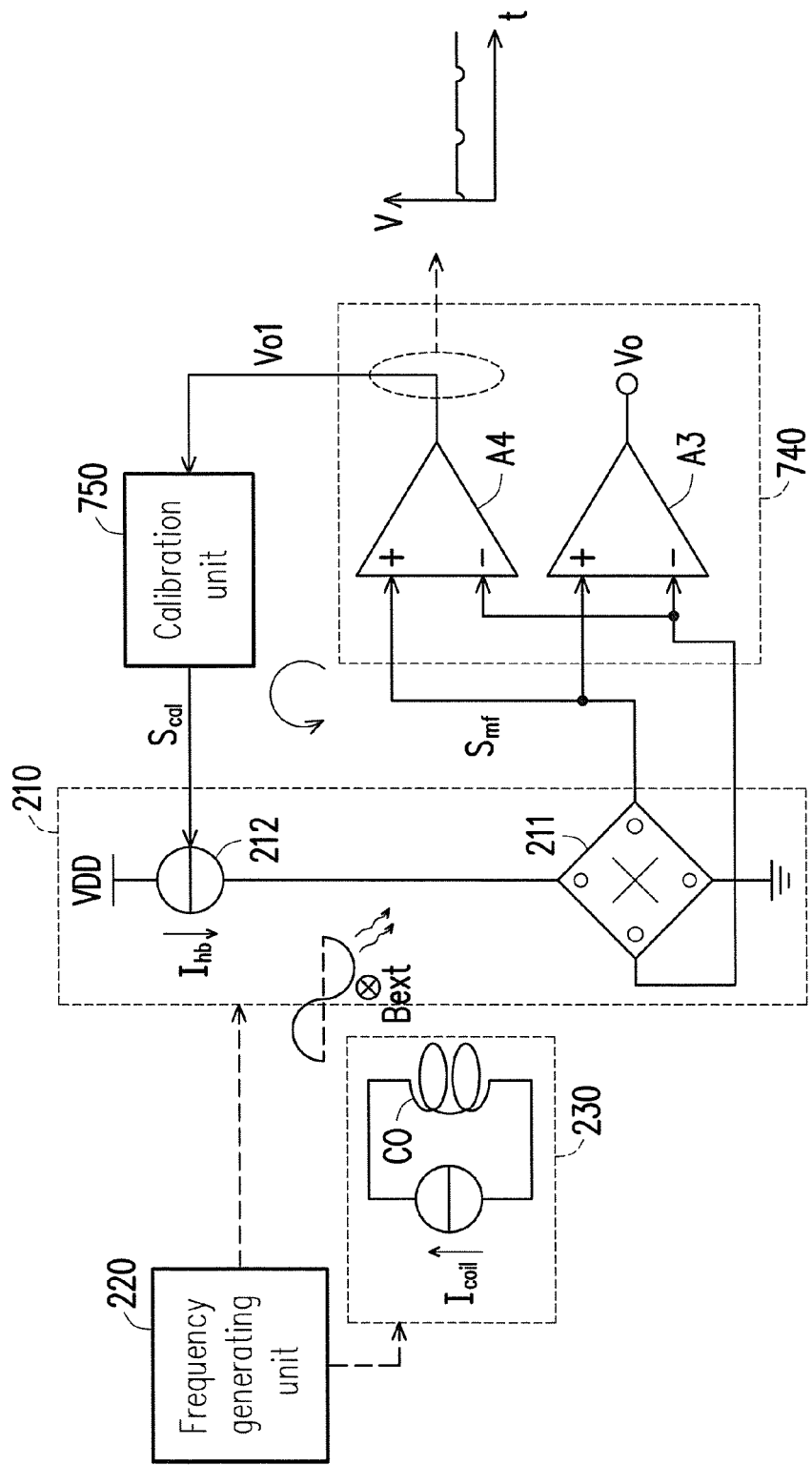
FIG. 7 is a schematic circuit diagram illustrating a magnetic sensing apparatus according to an exemplary embodiment of the disclosure.

FIG. 7 is a schematic circuit diagram illustrating a magnetic sensing apparatus according to an exemplary embodiment of the disclosure. With reference to FIG. 1, FIG. 2, FIG. 3A through FIG. 3C, FIG. 6 and FIG. 7, the same elements use the same reference numbers, which may refer to the exemplary embodiments above. A signal processing unit 740 of the present exemplary embodiment is different from the signal processing unit 240 illustrated in FIG. 2 in the signal processing unit 240 of FIG. 2 including one amplifier A1, while the signal processing unit 740 of FIG. 7 including amplifiers A3 and A4 coupled in parallel. In the present exemplary embodiment, the amplifiers A3 and A4 are coupled in parallel and an input terminal of each amplifier is configured to receive the MF sensing signal Smf, and an output terminal of the amplifier A3 is configured to transfer the MF sensing signal Smf into the output signal Vo. A calibration unit 750 of the present exemplar embodiment receives the corresponding output signal Vo1 from the amplifier A4, generates the calibration signal Scal according to the output signal Vo1 and transmits the calibration signal Scal to the bias circuit 212 to adjust the driving current Ihb of the bias circuit 212, so as to adjust the sensitivity of the MF probe 211. In other words, besides the design that the amplifiers are coupled in serial in the signal processing unit illustrated in FIG. 3A through FIG. 3C and FIG. 4, the signal processing unit of the disclosure may also be implemented by means of the amplifiers coupled in parallel. Likewise, the disclosure is not intent to limit the number of the amplifiers in the signal processing unit 740, and in other embodiments, the signal processing unit may also include three or more amplifiers coupled in parallel.

Figure 8:
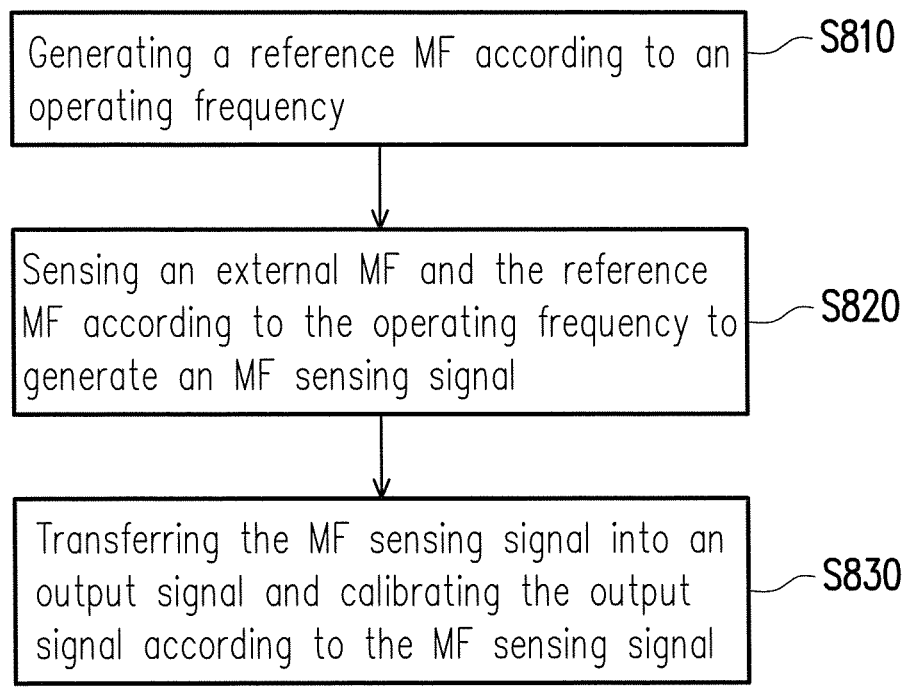
FIG. 8 is a flowchart illustrating a magnetic sensing method of a magnetic sensing apparatus according to an exemplary embodiment of the disclosure.

FIG. 8 is a flowchart illustrating a magnetic sensing method of a magnetic sensing apparatus according to an exemplary embodiment of the disclosure. With reference to FIG. 1 and FIG. 8, the magnetic sensing method of the present exemplary embodiment may be applicable to the magnetic sensing apparatus 100 of FIG. 1 and includes the following steps. In step S810, the magnetic sensing apparatus 100 generates the reference MF Bref according to the operating frequency Fctrl. In step S820, the magnetic sensing apparatus 100 senses the external MF Bext and the reference MF Bref according to the operating frequency Fctrl to generate the MF sensing signal Smf. In step S830, the magnetic sensing apparatus 100 transfers the MF sensing signal Smf into the output signal Vo and calibrates the output signal Vo according to the MF sensing signal Smf.

It should be noted for the persons who apply the present exemplary embodiment that step S830 may be implemented in many ways for corresponding to various embodiments of the disclosure and examples derived therefrom. For instance, in a scenario that step S830 is applied to the exemplary embodiment illustrated in FIG. 2, the calibration unit 250 generates the calibration signal Scal according to the reference sensing signal Sref, and the MF sensing unit 210 adjust the driving current Ihb of the bias circuit 212 according to the calibration signal Scal, so as to adjust the sensitivity of the MF sensing unit 210. Moreover, in another scenario that step S830 is applied to the exemplary embodiment illustrated in FIG. 4, the calibration unit 250 generates the calibration signal Scal according to the reference sensing signal Sref, and the first amplifier A1 of the signal processing unit 240 adjusts the signal gain thereof according to the calibration signal Scal, so as to calibrate the output signal Vo.

In summary, the magnetic sensing apparatus introduced by the disclosure includes the frequency generating unit capable of generating the operating frequency, and thereby, the reference MF generating unit and the MF sensing unit can be provided with the same operating frequency. The MF probe is originally provided with the frequency modulation circuit capable of capable of adjusting the operating frequency to adjust the sensitivity of the MF probe. Thus, based on the signal synchronized excitation effect and the circumstance where the at least one reference MF generated by the reference MF generating unit is not affected by ambient conditions, the frequency modulation circuit can process the sensing signal with the relatively high frequency generated by the inductance element in the MF probe as the DC reference signal. The DC reference signal corresponds to the value of the at least one reference MF, such that the calibration unit can calibrate the sensitivity of the MF probe or the output signal of the magnetic sensing apparatus by using the DC reference signal. In this way, the sensitivity of the magnetic sensing apparatus can be enhanced without additionally increasing excessive cost and causing any affection to the bandwidth of signal operation.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A magnetic sensing apparatus, comprising:
   a reference magnetic field (MF) generating unit, configured to provide a reference MF;

an MF sensing unit, configured to sense an external MF and the reference MF to provide an MF sensing signal, wherein the MF sensing signal comprises a first MF sensing signal having a first frequency and a second MF sensing signal having a second frequency, wherein the first frequency is greater than the second frequency;

a signal processing unit, coupled to the MF sensing unit and configured to receive and transfer the MF sensing signal into an output signal;

a calibration unit, configured to calibrate the output signal according to the MF sensing signal; and a frequency generating unit, coupled to the reference MF generating unit and the MF sensing unit and configured to provide an operating frequency, wherein the reference MF generating unit provides the reference MF according to the operating frequency, and the MF sensing unit senses the external MF and the reference MF according to the operating frequency, wherein the MF sensing unit comprises:

a frequency modulation circuit, receiving the operating frequency to modulate sensitivity of the MF sensing unit and processing the first MF sensing signal having the first frequency as a DC reference signal of the MF sensing signal according to the operating frequency and by means of a signal synchronized excitation effect, wherein the DC reference signal corresponds to the reference MF, and the second MF sensing signal corresponds to the external MF, and the calibration unit provides calibration signal according to the DC reference signal to calibrate the output signal.

2. The magnetic sensing apparatus according to claim 1, wherein the frequency generating unit dynamically adjusts the operating frequency and the reference MF using dynamic excitation frequency adjustment (DEFA) by means of the signal synchronized excitation effect.

3. The magnetic sensing apparatus according to claim 1, wherein the MF sensing unit comprises:

a bias circuit, configured to provide a driving current, and an MF probe, coupled to the bias circuit, wherein the MF probe receives the driving current to sense the external MF and the reference MF, and a value of the driving current corresponds to sensitivity of the MF sensing unit.

4. The magnetic sensing apparatus according to claim 3, wherein the signal processing unit comprises:

a first amplifier, having an input terminal configured to receive the MF sensing signal and an output terminal configured to transfer the MF sensing signal into the output signal.

5. The magnetic sensing apparatus according to claim 4, wherein the calibration unit receives a reference sensing signal with respect to the MF sensing signal from the first amplifier, generates a calibration signal according to the reference sensing signal and transmits the calibration signal to the bias circuit to adjust the driving current of the bias circuit, so as to adjust the sensitivity of the MF probe.

6. The magnetic sensing apparatus according to claim 4, wherein the signal processing unit further comprises:

a second amplifier, having an input terminal configured to receive the output signal and an output terminal configured to transfer the output signal into a second-level output signal.

7. The magnetic sensing apparatus according to claim 6, wherein the calibration unit receives a reference sensing signal with respect to the MF sensing signal from the second amplifier, generates a calibration signal according to the reference sensing signal and transmits the calibration signal to the first amplifier to adjust a gain of the first amplifier, so as to calibrate the output signal.

8. The magnetic sensing apparatus according to claim 6, wherein the calibration unit receives a reference sensing signal with respect to the MF sensing signal from the first amplifier, generates a calibration signal according to the reference sensing signal and transmits the calibration signal to the second amplifier to adjust a gain of the second amplifier, so as to calibrate the second-level output signal.

9. The magnetic sensing apparatus according to claim 6, wherein the calibration unit receives a reference sensing signal with respect to the MF sensing signal from the second amplifier, generates a calibration signal according to the reference sensing signal and transmits the calibration signal to the bias circuit to adjust the driving current of the bias circuit, so as to adjust the sensitivity of the MF probe.

10. The magnetic sensing apparatus according to claim 3, wherein the signal processing unit comprises:

a plurality of first amplifiers, each of the first amplifiers having an input terminal configured to receive the MF sensing signal and an output terminal configured to transfer the MF sensing signal into the output signal, wherein the calibration unit receives the corresponding output signal from one of the first amplifiers, generates a calibration signal according to the output signal and transmits the calibration signal to the bias circuit to adjust the driving current of the bias circuit, so as to adjust the sensitivity of the MF probe.

11. A magnetic sensing method of a magnetic sensing apparatus, comprising:

generating a reference MF according to an operating frequency;

sensing an external MF and the reference MF according to the operating frequency to generate an MF sensing signal; and transferring the MF sensing signal into an output signal and calibrating the output signal according to the MF sensing signal, the step comprises:

processing a first MF sensing signal having a first frequency as a DC reference signal of the MF sensing signal according to the operating frequency and by a signal synchronized excitation effect;

generating a calibration signal according to the reference signal and calibrating the output signal according to the calibration signal.

12. The magnetic sensing method according to claim 11, wherein the step of processing the first MF sensing signal having the first frequency as the DC reference signal of the MF sensing signal according to the operating frequency and by the signal synchronized excitation effect further comprises:

dynamically adjusting the operating frequency and the reference MF using DEFA) by means of the signal synchronized excitation effect.

13. The magnetic sensing method according to claim 11, wherein the step of transferring the MF sensing signal into the output signal and calibrating the output signal according to the MF sensing signal further comprises:

generating a calibration signal according to a reference sensing signal and adjusting a driving current according to the calibration signal, so as to adjust sensitivity of the magnetic sensing apparatus.

14. The magnetic sensing method according to claim 11, wherein the step of transferring the MF sensing signal into the output signal and calibrating the output signal according to the MF sensing signal further comprises:
generating a calibration signal according to a reference sensing signal and adjusting a signal gain according to the calibration signal, so as to calibrate the output signal.

* * * * *